(12) United States Patent
Ikeda

(10) Patent No.: US 8,294,133 B2
(45) Date of Patent: Oct. 23, 2012

(54) ELECTRONIC ELEMENT AND ELECTROCONDUCTIVITY CONTROL METHOD

(75) Inventor: Naoshi Ikeda, Okayama (JP)

(73) Assignee: National University Corporation Okayama University, Okayama (JP)

( * ) Notice: Subject to any disclaimer, the term of this patent is extended or adjusted under 35 U.S.C. 154(b) by 32 days.

(21) Appl. No.: 12/674,726

(22) PCT Filed: Aug. 22, 2008

(86) PCT No.: PCT/JP2008/065045
§ 371 (c)(1),
(2), (4) Date: Mar. 21, 2011

(87) PCT Pub. No.: WO2009/028426
PCT Pub. Date: Mar. 5, 2009

(65) Prior Publication Data
US 2011/0168967 A1 Jul. 14, 2011

(30) Foreign Application Priority Data
Aug. 24, 2007 (JP) ................. P2007-219050

(51) Int. Cl.
*H01L 47/00* (2006.01)
(52) U.S. Cl. ............................................. 257/4
(58) Field of Classification Search ............. 257/4
See application file for complete search history.

(56) References Cited

U.S. PATENT DOCUMENTS
3,100,849 A * 8/1963 Hollander, Jr. ............... 327/564

FOREIGN PATENT DOCUMENTS
| JP | 2005079565 A | 3/2005 |
| JP | 2005200249 A | 7/2005 |
| JP | 2005216951 A | 8/2005 |
| JP | 2007223886 A | 9/2007 |

OTHER PUBLICATIONS

Soshin Chikazumi; Introduction to Solid State Science; 1999; pp. 178-180; Shokabo Publishing Co. Ltd.
Naoshi Ikeda et al.; Charge Frustration and Dielectric Dispersion in LuFe2O4; Journal of the Physical Society of Japan; May, 2000; pp. 1526-1532; vol. 69, No. 5.
Noboru Kimizuka et al.; The Systems R2O3-M2O3-M'O; Chapter 90; Handbook on the Physics and Chemistry of Rare Earths; 1990; pp. 283-384; vol. 13; Elsevier Science Publishers B.V.
F. Sawano et al.; An Organic Thyristor; Nature; Sep. 2005; pp. 522-524; vol. 437; Nature Publishing Group.
Naoshi Ikeda; Ferroelectricity from Iron Valence Ordering in the Charge-Frustrated System LuFe2O4; Nature; Aug. 2005; pp. 136-138; vol. 436; Nature Publishing Group.

(Continued)

*Primary Examiner* — Mary Wilczewski
*Assistant Examiner* — Paul Patton
(74) *Attorney, Agent, or Firm* — Stevens & Showalter LLP

(57) ABSTRACT

An electronic device 1 includes an electrical conductivity changeable body 2 whose electrical conductivity changes according to an electric field and an electric field applying device 3 that applies an electric field to the electrical conductivity changeable body 2. The electrical conductivity changeable body 2 contains $RFe_2O_4$, and its electrical conductivity changes due to a state of internal electrons being changed according to an electric field 4 applied from the outside by the electric field applying device 3. Thereby, an electronic device capable of changing its electrical conductivity in accordance with application of a small electric field is realized.

11 Claims, 15 Drawing Sheets

OTHER PUBLICATIONS

Yoshiko Kuwahara; International Preliminary Report on Patentability for PCT/JP2008/065045; Mar. 18, 2010; The International Bureau of WIPO; Geneva Switzerland.

International Search Report for PCT/JP2008065045; Nov. 25, 2008; Japanese Patent Office.

* cited by examiner (a)

(b)

(c)

(d)

DEPLETION LAYER (e)

ELECTRONIC ELEMENT AND ELECTROCONDUCTIVITY CONTROL METHOD

TECHNICAL FIELD

The present invention relates to an electronic device including an electrical conductivity changeable body whose electrical conductivity changes according to an electric field, and electric field applying means for applying an electric field to the electrical conductivity changeable body, and to an electrical conductivity control method using the electronic device.

BACKGROUND ART

A computer logic element is composed of, for example, a silicon transistor, and in this silicon transistor, electrical conductivity of an electronic device including a semiconductor junction interface is changed by injecting electrons or holes into the semiconductor junction interface, to control an electric current flowing in the electronic device (refer to Non-Patent Document 1).

Here, (a) to (e) in FIG. 5 show diagrams for explanation of a junction interface of a conventional silicon transistor. The electronic structure of a p-n junction shown in FIG. 5($a$) will be described. As shown in FIG. 5($b$), impurity levels respectively occur in the vicinity of their valence bands and conductive bands in the p-type and n-type semiconductors, and holes and conduction electrons are generated respectively in the valence bands and the conductive bands. The electrons move until the Fermi levels of both sides match each other after bonding the both sides, to provide a level distribution as shown in FIG. 5($c$). As a result, in the vicinity of the junction part, the electrons in the conductive band of the n-type are coupled with the holes in the valence band of the p-type, to generate a depletion layer without conductive charges (FIG. 5($d$)). At a place where there are conductive charges, its electric potential is uniform in the same way as that in metal, however, an electric potential distribution as shown in FIG. 5($e$) is brought about in a depletion layer due to its space charge, which causes a step in the electric potential. This is called a potential barrier.

Non-Patent Document 1: Soshin Chikazumi, "Introduction to Solid State Science," Shokabo Publishing Co., Ltd., 1999, p. 178, FIG. 9-3

Non-Patent Document 2: N. Ikeda et al., "Ferroelectricity from iron valence ordering in the charge-frustrated system LuFe2O4," Nature, Vol. 436, No. 7054, pp. 1136-1138 (2005)

Non-Patent Document 3: N. Ikeda et al., "Charge Frustration and Dielectric Dispersion in LuFe2O4," Journal of the Physical Society of Japan, Vol. 69, No. 5, pp. 1526-1532 (2000)

DISCLOSURE OF THE INVENTION

Problems to be Solved by the Invention

However, in the conventional silicon transistor described above, an electric potential difference is spontaneously generated at a semiconductor junction interface. This electric potential difference due to an internal electric field is approximately 0.7V at a silicon p-n junction, for example. Therefore, in a silicon transistor, it is impossible to control a minute voltage, for example, it is difficult to prepare a logic element operated at 0.7V or less, even for a computer logic element.

In order to solve the above-described problem, an object of the present invention is to provide an electronic device in which a state of internal electrons is changed in accordance with application of a minute electric field, thereby it is possible to change its electrical conductivity, and to provide an electrical conductivity control method.

Means for Solving the Problems

An electronic device according to the present invention includes an electrical conductivity changeable body whose electrical conductivity is changed according to an electric field, and electric field applying means for applying an electric field to the electrical conductivity changeable body, the electrical conductivity changeable body contains $RFe_2O_4$.

In accordance with the above-described feature, the electrical conductivity changeable body whose electrical conductivity changes according to the electric field applied by the electric field applying means contains $RFe_2O_4$. The $RFe_2O_4$ has the property that electrons are regularly arranged by mutual electrostatic interactions, and further, the regularly arranged electrons have electric polarizations, and when an electric field is applied to those from the outside, the regular array is disarrayed, which changes its electrical conductivity. By use of this property, it is possible to configure an electronic device whose electrical conductivity changes according to a minute electric field applied by the electric field applying means.

In the electronic device according to the present invention, it is preferable that the electric field applying means applies an electric field of 0.7V or less, and the electrical conductivity changeable body is changed in electrical conductivity according to the electric field of 0.7V or less. In accordance with the above-described configuration, it is possible to realize an electronic device for a computer operated at a voltage of 0.7V or less.

An electrical conductivity control method according to the present invention includes applying an electric field to an electrical conductivity changeable body containing $RFe_2O_4$, and controlling electrical conductivity of the electrical conductivity changeable body.

In accordance with this feature, the electrical conductivity changeable body whose electrical conductivity changes according to an applied electric field contains $RFe_2O_4$. The $RFe_2O_4$ has the property that electrons are regularly arranged by mutual electrostatic interactions, and further, the regularly arranged electrons have electric polarizations, and when an electric field is applied to those from the outside, the regular array is disarrayed, which changes its electrical conductivity. By use of this property, it is possible to obtain an electrical conductivity control method by which electrical conductivity of the electrical conductivity changeable body changes according to an electric field applied by the electric field applying means.

To describe in more detail, the electronic device according to the present invention includes an electrical conductivity changeable body in which a state of internal electrons is changed according to an electric field applied from the outside, to change its electrical conductivity, and electric field applying means for applying an electric field to the electrical conductivity changeable body from the outside, the electrical conductivity changeable body comprises a compound having a layered triangular lattice structure, whose composition is expressed by $(RMbO_{3-\delta})_n(MaO)_m$ (where R is at least one element selected from In, Sc, Y, Dy, Ho, Er, Tm, Yb, Lu, Ti, Ca, Sr, Ce, Sn and Hf; Ma and Mb are at least one element selected from Ti, Mn, Fe, Co, Cu, Ga, Zn, Al, Mg and Cd so as to allow their overlapping; n is an integer number of 1 or more; m is an integer number of 0 or more; and δ is a real number of 0 or more and 0.2 or less).

Further, an electrical conductivity control method according to the present invention includes applying an electric field to an electrical conductivity changeable body from the outside, and controlling a change in electrical conductivity of the electrical conductivity changeable body on the basis of a change in state of internal electrons according to the electric field applied to the electrical conductivity changeable body, and the electrical conductivity changeable body comprises a compound having a layered triangular lattice structure, whose composition is expressed by $(RMbO_{3-\delta})_n(MaO)_m$ (where R is at least one element selected from In, Sc, Y, Dy, Ho, Er, Tm, Yb, Lu, Ti, Ca, Sr, Ce, Sn and Hf; Ma and Mb are at least one element selected from Ti, Mn, Fe, Co, Cu, Ga, Zn, Al, Mg and Cd so as to allow their overlapping; n is an integer number of 1 or more; m is an integer number of 0 or more; and δ is a real number of 0 or more and 0.2 or less).

In accordance with the above-described configuration, as described above with respect to $RFe_2O_4$, a structure in which two triangular lattice layers composed of Ma-O or Mb-O are laminated is formed in the crystal structure of the electrical conductivity changeable body. Then, in such a laminated structure, the charge number of Ma or Mb ions mainly composed of transition metal, that constitute a triangular lattice in one layer thereof, and the charge number of Ma or Mb ions mainly composed of transition metal, that constitute a triangular lattice in the other layer do not match each other, which forms an electron arrangement and an electron density distribution in a dipolar form, that is characteristic to the above-described compound.

In the electronic device according to the present invention, electrical conductivity in its crystal is changed by utilizing the phenomenon that the charge order with dipolar arrangement of the electron density described above is disarrayed by an electric field applied from the outside. Further, in the element utilizing such breakdown of the charge order in the crystal, a p-n junction is not required, and therefore, an electric potential difference by an internal electric field is not generated. Accordingly, in accordance with the above-described configuration, it is possible to realize an electronic device in which a state of internal electrons is changed in accordance with application of a small electric field, thereby it is possible to change its electrical conductivity, and an electrical conductivity control method. The electronic device based on such a principle of operation was first found by the inventor of the present application.

In the electronic device having the above-described configuration and the electrical conductivity control method, the compound having the layered triangular lattice structure is preferably $RFe_2O_{4-\delta}$. This corresponds to the case in which Ma=Mb=Fe and n=m=1 in the above-described composition formula.

In this case, a structure in which two triangular lattice layers respectively composed of Fe—O are laminated is formed in the crystal structure of the electrical conductivity changeable body. Then, the charge number of Fe in one layer thereof and the charge number of Fe in the other layer do not match each other because there are many $Fe^{2+}$ in the one layer and there are many $Fe^{3+}$ in the other layer, thereby forming an electron arrangement in a dipolar form. In the electronic device using $RFe_2O_4$, by utilizing such a phenomenon that a charge order is disarrayed by an electric field applied from the outside, and, as described above, an electronic device in which a state of internal electrons is changed in accordance with application of a small electric field, thereby changing its electrical conductivity is realized.

Here, the electrical conductivity changeable body preferably comprises a single crystal or a polycrystal of a compound having a layered triangular lattice structure, or an aggregate of powder thereof. With respect to a crystal of the electrical conductivity changeable body, the above-described effect that its electrical conductivity changes in accordance with application of a small electric field can be obtained in any one of these configurations.

With respect to a configuration of the electric field applying means, it is preferable that, in the electronic device, the electric field applying means includes a first electrode formed on the electrical conductivity changeable body, and a second electrode disposed so as to be electrically separated from the first electrode on the electrical conductivity changeable body, and is capable of applying the electric field to the electrical conductivity changeable body by applying a voltage between the first electrode and the second electrode. In accordance with such a configuration, it is possible to suitably apply an electric field necessary for changing its electrical conductivity to the electrical conductivity changeable body.

In this case, the electric field applying means may include voltage applying means for applying a voltage between the first electrode and the second electrode. Or, the electric field applying means may be composed of, for example, only the first electrode and the second electrode described above, and may have a configuration in which a voltage applying device which is an external device is connected to these electrodes as needed.

Further, in the above-described configuration, the voltage applied between the first electrode and the second electrode is preferably a voltage of 0.7V or less. Thereby, it is possible to realize an electronic device which can be operated at a sufficiently low applied voltage as compared with, for example, a silicon transistor or the like. Further, the element whose electrical conductivity changes with such a low applied voltage is made possible by use of the compound having the crystal structure described above.

With respect to a concrete configuration of the electronic device, the electronic device may have a configuration in which the first electrode and the second electrode are disposed at positions opposing each other on a first axis with respect to the layered triangular lattice structure of the electrical conductivity changeable body, and a third electrode and a fourth electrode are formed at positions opposing each other on a second axis different from the first axis with respect to the electrical conductivity changeable body, and a current-voltage property between the third electrode and the fourth electrode changes by applying a voltage between the first electrode and the second electrode. Such a device can be used as a transistor element having a function as a transistor that controls a current-voltage property between the third and fourth electrodes by an applied voltage between the first and second electrodes.

Further, as another configuration of the electronic device, the electronic device may have a configuration in which the first electrode and the second electrode are disposed at positions opposing each other on a predetermined axis with respect to the layered triangular lattice structure of the electrical conductivity changeable body, and a current-voltage property of the electrical conductivity changeable body can be caused to make a transition from a high-resistive state to a low-resistive state by applying a voltage to make an electric current flow between the first electrode and the second electrode, and information is retained in the electrical conductivity changeable body by utilizing dependence on a resistance change history of the transition of the resistive state. Such a device can be used as a memory element that retains information on the basis of, for example, a resistance change history with a voltage or an electric current application history between the first and second electrodes, and a change in resistive state of the electrical conductivity changeable body thereby.

In such a memory device, concretely, in the electrical conductivity changeable body, it is preferable that, in the case in which there is no electric current application history in one direction between the first electrode and the second electrode, when an electric current made to flow in the one direction between the first electrode and the second electrode is made to be increasing, its resistive state is caused to make a transition from a high-resistive state to a low-resistive state, and in the case in which there is an electric current application history in the one direction, when an electric current made to flow in the one direction between the first electrode and the second electrode is made to be increasing, its resistive state is in a low-resistive state, which does not accompany a transition of the resistive state. Thereby, it is possible to suitably realize retention of information in the memory device.

Further, in the electrical conductivity changeable body, it is more preferable that the electric current application history in the one direction is caused to disappear by making an electric current flow in the other direction between the first electrode and the second electrode. Thereby, it is possible to suitably realize erasing of the information retained in the memory device.

Effect of the Invention

In the electronic device according to the present invention, as described above, the electrical conductivity changeable body contains $RFe_2O_4$, which exerts the effect that an electronic device whose electrical conductivity changes according to a minute electric field applied by the electric field applying means can be provided.

Moreover, in accordance with the electronic device and the electrical conductivity control method according to the present invention, by using a compound having a layered triangular lattice structure, whose composition is expressed by $(RMbO_{3-\delta})_n(MaO)_m$, as an electrical conductivity changeable body, it is possible to realize an electronic device in which a state of internal electrons is changed in accordance with application of a small electric field, thereby changing its electrical conductivity, and to realize an electrical conductivity control method.

DESCRIPTION OF THE SYMBOLS

Figure 1:
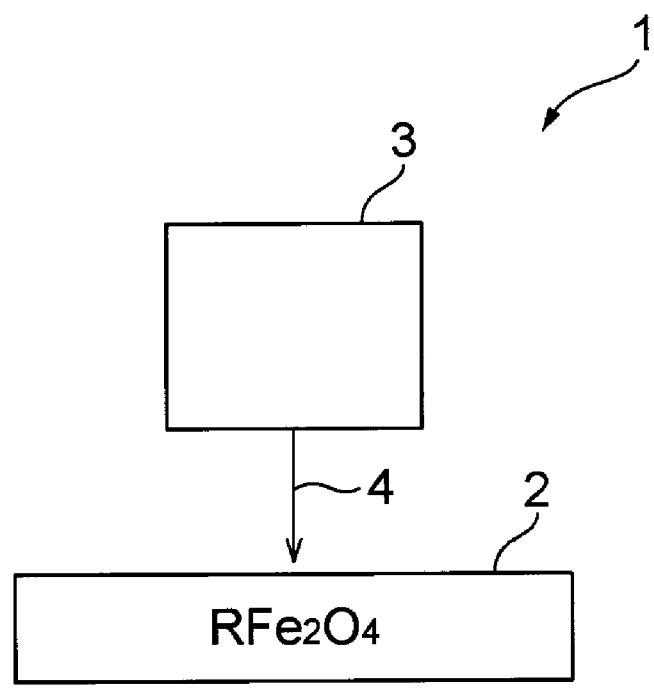
FIG. 1 is a diagram showing a schematic configuration of an electronic device according to an embodiment.

1—Electronic device, 2—Electrical conductivity changeable body, 3—Electric field applying device, 4—Electric field, 10—Electrical conductivity changeable body, 11—First electrode, 12—Second electrode, 16—Third electrode, 17—Fourth electrode, 21, 22—Power source, 30—Electrical conductivity changeable body, 31—First electrode, 32—Second electrode, 35—Power source.

BEST MODES FOR CARRYING OUT THE INVENTION

Hereinafter, preferred embodiments of an electronic device and an electrical conductivity control method according to the present invention will be described in detail with reference to the drawings. Note that, in the description of the drawings, the same components are denoted by the same reference symbols, and overlapping descriptions thereof will be omitted. Further, the dimensional ratios in the drawings do not necessarily match those in the descriptions.

An embodiment of the present invention on the basis of FIG. 1 to FIG. 4 will be described as follows. FIG. 1 is a diagram showing a schematic configuration of an electronic device 1 according to the embodiment. The electronic device 1 includes an electrical conductivity changeable body 2 whose electrical conductivity changes according to an electric field and an electric field applying device 3 that applies an electric field 4 to the electrical conductivity changeable body 2. The electrical conductivity changeable body 2 contains $RFe_2O_4$.

$RFe_2O_4$ is a material discovered in the latter half of the 1970s, and R denotes rare-earth ion and the material is expressed as $RFe_2O_4$ (R=Y, In, Sc, Dy, Ho, Er, Tm, Yb, Lu). The basic information on this material is described in the paper "N. Kimizuka, E. Takayama-Muromachi & K. Siratori: Handbook on the Physics and Chemistry of Rare Earths Vol. 13. (eds K. A. Gschneidner, Jr & L. Eyring Science, Amsterdam, 1990) 283."

$RFe_2O_4$ has the property that electrons are regularly arranged by mutual electrostatic interactions. The regularly arranged electrons have electric polarizations, and when an electric field is applied to those from the outside, the regular array is disarrayed, which changes its electrical conductivity. By use of this property, an electronic device whose electrical conductivity changes by an external electric field is prepared.

The substance $RFe_2O_4$ taken up here has the property that electrons are regularly arranged by mutual electrostatic interactions. Moreover, the regularly arranged electrons have electric polarizations, and when an electric field is applied to those from the outside, the regular array is disarrayed, which changes its electrical conductivity. Thereby, it is possible to control its electrical conductivity with an external electrode, which makes it possible to realize an electronic device by which a silicon transistor is replaced. Note that the crystal structure of $RFe_2O_4$ and the characteristic thereof as an electrical conductivity changeable body will be further described in detail later.

Provided that such an electronic device is operated as a computer logic element, it is possible to make its operation speed much faster. Provided that a function equivalent to that of a transistor can be created without using a semiconductor junction interface, it is possible to realize, for example, a computer element operated at 0.1V or less. Therefore, provided that the electronic device is operated as a computer logic device, its operation speed can be increased sevenfold or more.

Because there is no loss in voltage drop at a junction interface, in a high-current switch circuit, it is easy to cool down a large-size current element circuit, which makes it possible to easily configure a high-current switch circuit which is tenfold or more larger than a conventional circuit. As a concrete example of a high-current switch circuit having a switch at approximately 1 ampere, electrical appliances for home use can be cited. As a concrete example of a high-current switch circuit having a switch at approximately 1000 amperes, for example, large-size motors for engines can be cited. Large-size motors for engines using a switch at approximately 1000 amperes are used as engines for railroad vehicles (electric trains). A transistor for controlling this high-current switch circuit is installed on a large-size cooler because heat of approximately 1 kW is generated therein in some cases.

A substance $\theta\text{-(BEDT-TTF)}_2\text{CsM(SCN)}_4$ (M=Zn and Co) as well has a property that electrons are regularly arranged by mutual electrostatic interactions at −270° C., and moreover, the regularly arranged electrons have electric polarizations, and when an electric field is applied to those from the outside, the regular array is disarrayed, which changes its electrical conductivity. The substance $\theta\text{-(BEDT-TTF)}_2\text{CsM(SCN)}_4$ (M=Zn and Co) is described in the paper "F. sawano et al., Nature, 437 (2005) 522-524".

Figure 2:
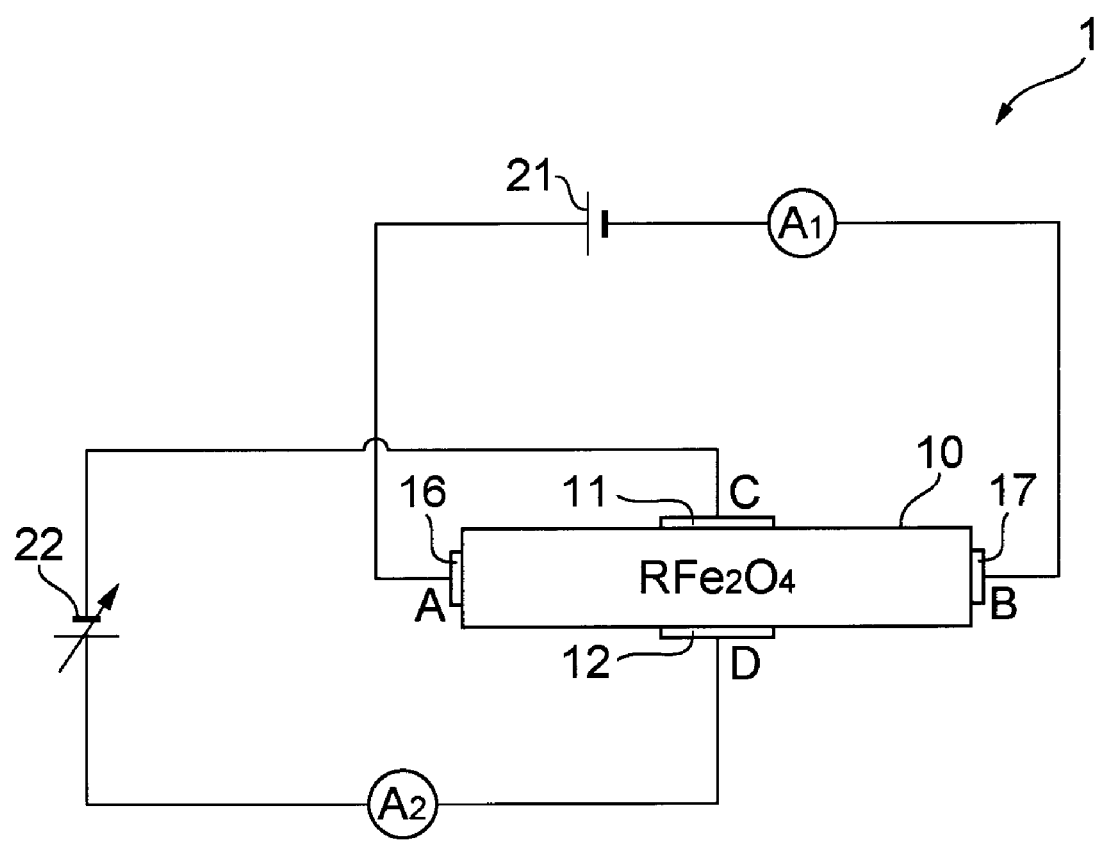
FIG. 2 is a diagram showing a concrete configuration of the electronic device according to the embodiment.
Figure 3:
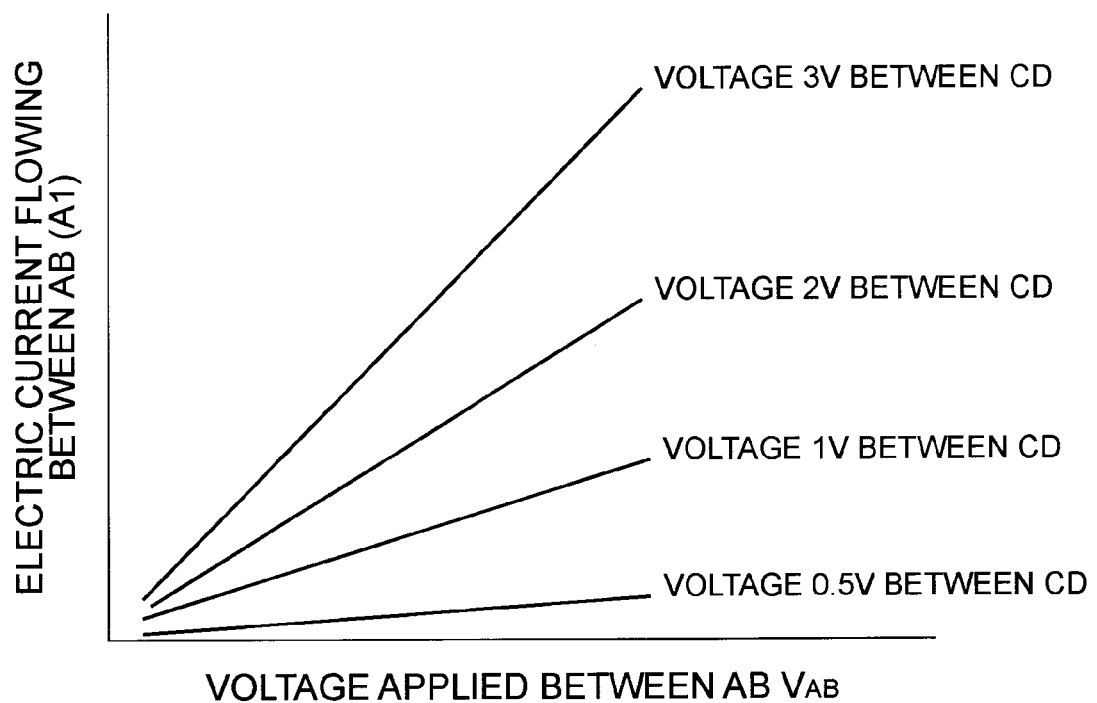
FIG. 3 is a graph showing a relationship between voltages applied to and electric currents flowing in an electrical conductivity changeable body provided in the electronic device according to the embodiment.

FIG. 2 is a diagram showing a concrete configuration of the electronic device 1 according to the embodiment. FIG. 3 is a graph showing a relationship between voltages applied to and electric currents flowing in the electrical conductivity changeable body 10 provided in the electronic device 1 according to the embodiment.

The electrical conductivity changeable body 10 containing $RFe_2O_4$ is shaped into a plate shape, and a third electrode 16 and a fourth electrode 17 are respectively attached to electrode installation positions A and B on the both ends of the electrical conductivity changeable body 10. A first electrode 11 and a second electrode 12 are respectively attached to electrode installation positions C and D on the front surface and the rear surface of the electrical conductivity changeable body 10. A power source 21 and a variable power source 22 are provided for the electronic device 1. One end of the power source 21 is connected to the third electrode 16, and the other end thereof is connected to one end of an ammeter A1. The other end of the ammeter A1 is connected to the fourth electrode 17. One end of the variable power source 22 is connected to the first electrode 11, and the other end thereof is connected to one end of an ammeter A2. The other end of the ammeter A2 is connected to the second electrode 12.

An electric current is made to flow between the electrodes 16 and 17, and the electric current is measured by the ammeter A1. Then, a bias voltage applied between the electrodes 11 and 12 is changed. As shown in FIG. 3, the electric current flowing between the electrodes 16 and 17 (between A and B) changes by changing a voltage applied between the electrodes 11 and 12 (between C and D). Accordingly, the electric current flowing between the electrodes A and B can be controlled by the voltage applied between the electrodes C and D.

Figure 4:
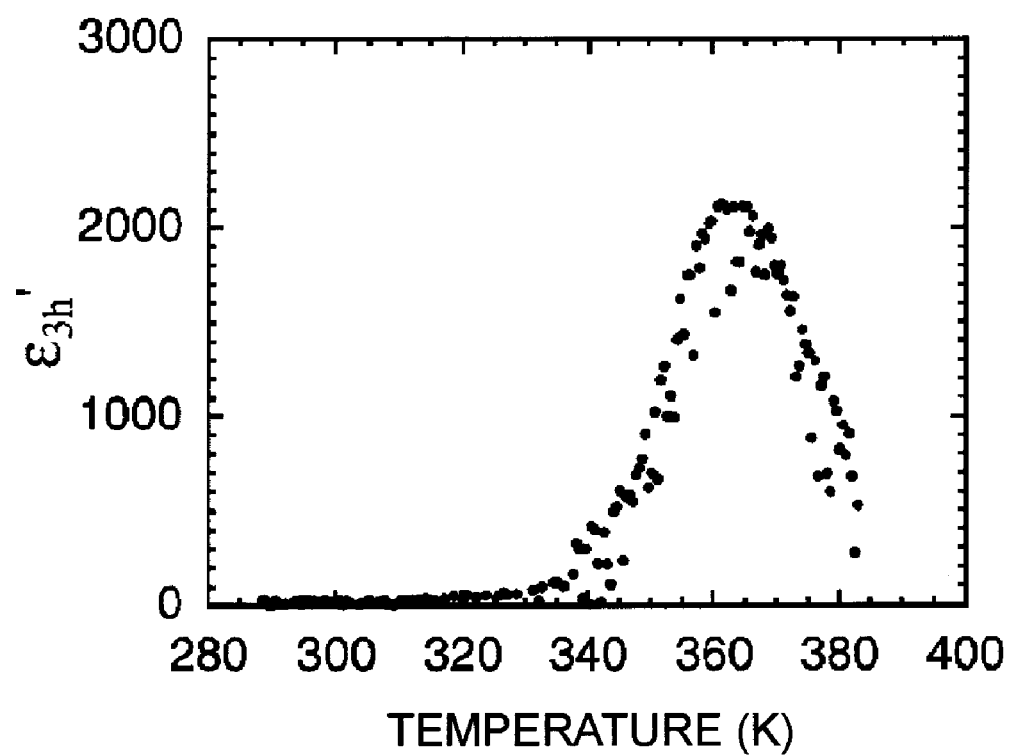
FIG. 4 is a graph showing that the regular array of electrons is unfastened, which generates an electrical response proportional to a cube of an external electric field.
Figure 5:
FIG. 5 shows diagrams for explanation of a p-n junction interface included in a conventional silicon transistor.
Figure 5:
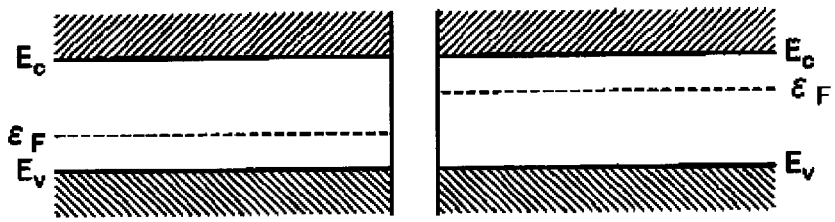
Figure 5:
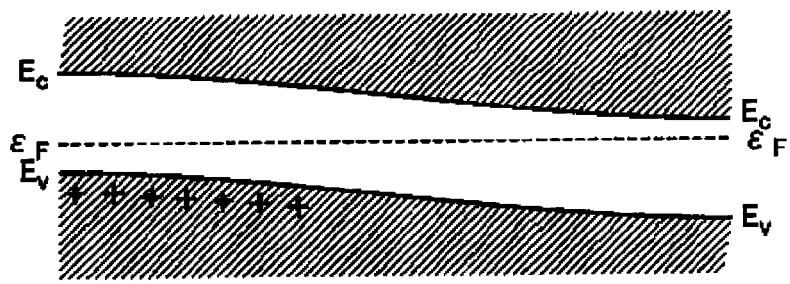
Figure 5:
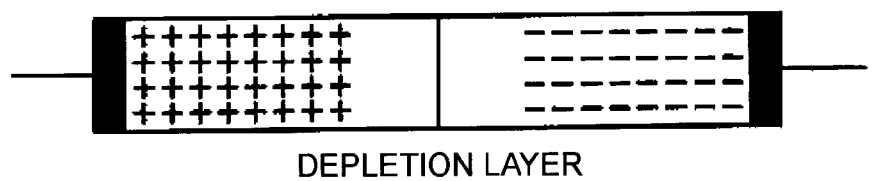
Figure 5:
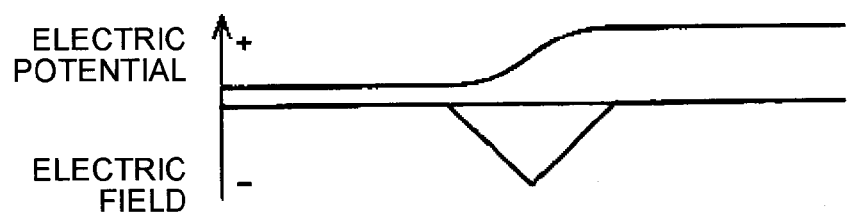

FIG. 4 is a graph showing that the regular array of electrons is unfastened, which generates an electrical response proportional to a cube of an external electric field. This graph shows that the regular array of electrons is unfastened within a temperature range from 340K to 380K, thereby generating an electrical response proportional to a cube of an external electric field. Here, in the above-described electrical conductivity changeable body, electrons distributed in a dipolar form are distributed so as to have various lengths of order. The phenomenon shown in FIG. 4 is considered to show a transition phenomenon that electrons distributed so as to have various lengths of order in this way are rearranged.

The present invention is not limited to the above-described embodiment, and various modifications are possible within a range shown in claims. That is, embodiments achieved by combining technical means appropriately changed within the range shown in claims as well are included in the technical scope of the present invention.

The electronic device and the electrical conductivity control method according to the present invention will be further described. First, a crystal used as an electrical conductivity changeable body in the electronic device according to the present invention and its property will be described.

In the above-described embodiment, the case in which $RFe_2O_4$ is used as an electrical conductivity changeable body has been described, however, in the electronic device and the electrical conductivity control method according to the present invention, it is generally preferable that an electrical conductivity changeable body comprises a compound having a layered triangular lattice structure, whose composition is expressed by $(RMbO_{3-\delta})_n(MaO)_m$ (where R is at least one element selected from In, Sc, Y, Dy, Ho, Er, Tm, Yb, Lu, Ti, Ca, Sr, Ce, Sn and Hf; Ma and Mb are at least one element selected from Ti, Mn, Fe, Co, Cu, Ga, Zn, Al, Mg and Cd so as to allow their overlapping; n is an integer number of 1 or more; m is an integer number of 0 or more; and δ is a real number of 0 or more and 0.2 or less). When an electric field is applied to such an electrical conductivity changeable body from the outside, a state of internal electrons thereof is changed according to the applied electric field, thereby it is possible to change its electrical conductivity. Here, it is particularly preferable that n is an integer number of 1 or more and 3 or less. Further, it is particularly preferable that m is an integer number of 0 or more and 1 or less.

Further, as a compound having a layered triangular lattice structure used for an electrical conductivity changeable body, specifically, $RFe_2O_{4-\delta}$ can be suitably used. This corresponds to the case in which Ma=Mb=Fe and n=m=1 in the above-described composition formula. Note that, hereinafter, description of oxygen defect δ will be omitted except for a case of particular necessity, and simply expressed as $(RMbO_3)_n(MaO)_m$ or $RFe_2O_4$.

Figure 6:
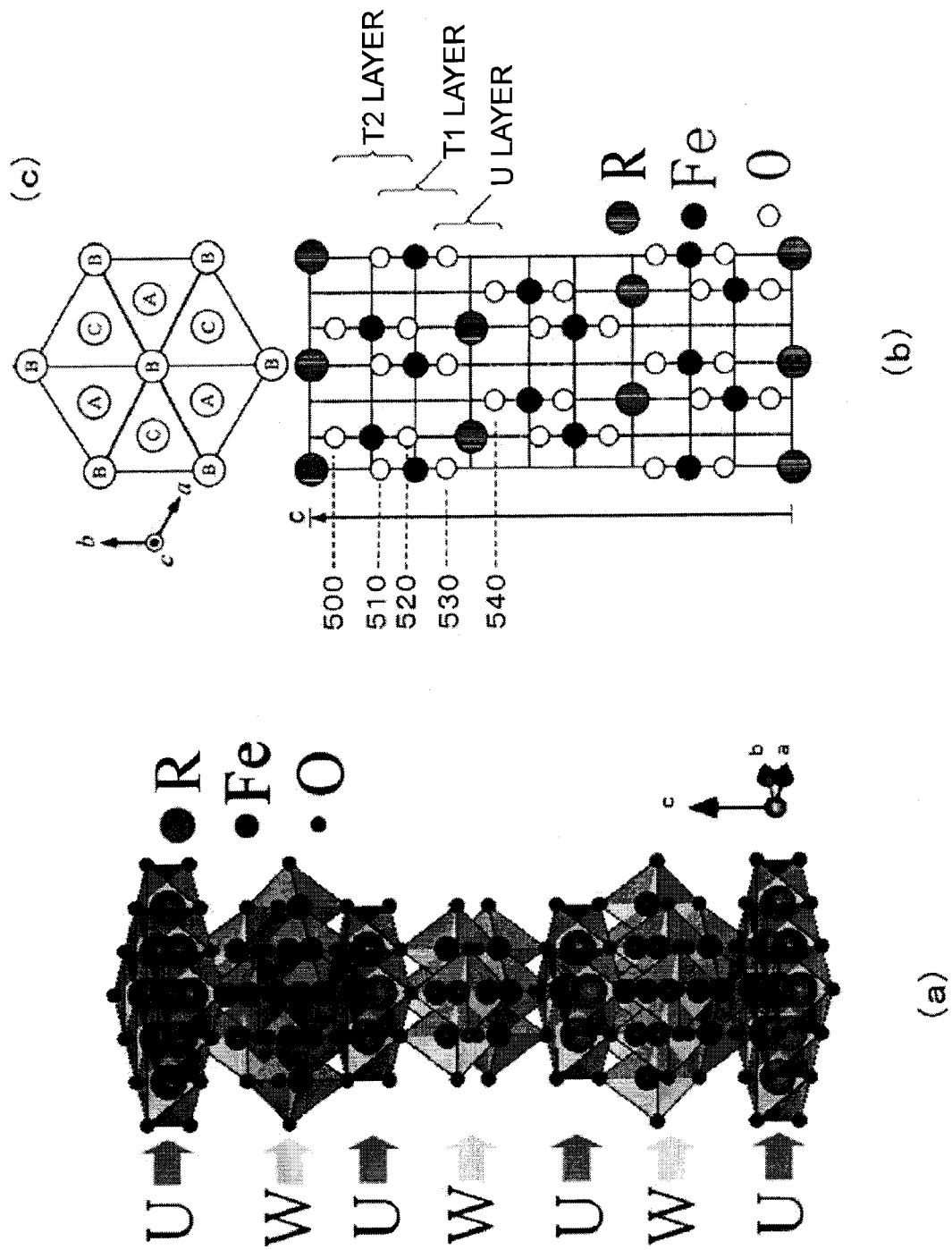
FIG. 6 shows a crystal structure of $RFe_2O_4$ and includes (a) a cubic diagram of the crystal, (b) a diagram viewed from the b axis direction, and (c) a diagram viewed from above in the c axis.

The crystal structure and property of the above-described compound will be described by use of $RFe_2O_4$ as an example (refer to Non-Patent Documents 2 and 3). FIG. 6 shows diagrams showing a crystal structure of $RFe_2O_4$, and (a) in FIG. 6 shows a cubic diagram of the crystal, (b) in FIG. 6 shows a diagram in which the crystal is viewed from the b axis direction, and (c) in FIG. 6 shows a diagram in which the crystal is viewed from above in the c axis.

As shown in FIG. 6, the crystal of $RFe_2O_4$ has a laminated structure in which triangular lattice layers composed of R, Fe, and O are laminated in layers in the c axis direction. Focusing on R and Fe, O in the upper and lower two layers are octahedrally-coordinated (this layer is called a U layer) with respect to R, and an O layer in substantially the same plane as an Fe layer and the O in the two layers located above and below are coordinated in a trigonal bipyramid manner (this layer is called a T layer) with respect to Fe. Thus, this crystal has the structure in which the two T layers are sandwiched between the U layers as a whole. Here, the two T layers are respectively called a T1 layer and a T2 layer. Further, the two T layers sandwiched between the U layers are called a W layer.

FIG. 6(b) shows a diagram in which the U layer, the T1 layer, and the T2 layer described above are viewed from the b axis direction of a hexagonal crystal. The U layer is a layer including R and layers of O above and below R (layers 530 and 540). The T1 layer is composed of Fe located above R in the c axis, a layer of O (layer 520) in substantially the same plane as Fe, and layers of O (layers 510 and 530) located above and below in the c axis. Further, the T2 layer is composed of Fe located above the T1 layer in the c axis, the layer of O (layer 510) in substantially the same plane as Fe, and layers of O (layers 500 and 520) located above and below in the c axis. Accordingly, the structure is formed such that oxygen above and below the U layer, the T1 layer, and the T2 layer are shared with adjacent layers.

Further, FIG. 6(c) shows a diagram in which the crystal is viewed from above on the c axis. In the above-described crystal structure, reference marks of A, B, and C are attached to the triangular lattice layers laminated in the c axis direction. Because these layers are laminated while rotating the phases of A, B, and C in the c axis direction, the structure when viewed from the c-axis direction is as shown in FIG. 6(c).

In the above-described crystal structure, the two Fe—O triangular lattice layers existing in the W layer serve the principal role in a formation mechanism for the solid state property characteristic of $RFe_2O_4$ by a geometric feature which a triangle has. Further, in consideration of $(RMbO_3)_n(MaO)_m$ more generally, with a structure in which two triangular lattice layers composed of Ma-O or Mb-O are laminated, the solid state property characteristic of $(RMbO_3)_n(MaO)_m$, is formed in the same way as $RFe_2O_4$.

Figure 7:
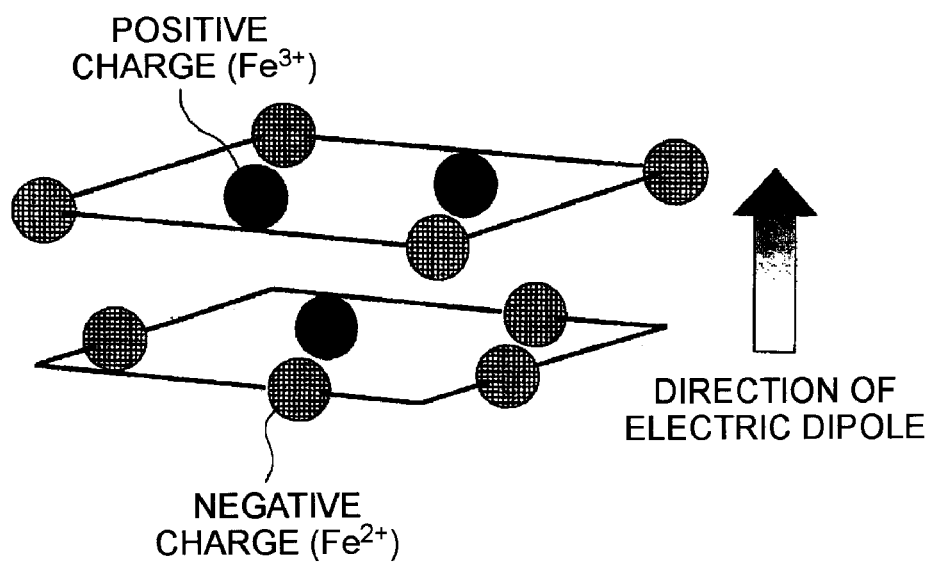
FIG. 7 is a diagram showing a structure in which two triangular lattice planes are laminated in the crystal structure of $RFe_2O_4$.

FIG. 7 is a diagram showing a structure of Fe ions in which two triangular lattice layers are laminated in the crystal structure of $RFe_2O_4$ described above. As shown in FIG. 7, in such a laminated structure of triangular lattice layers, the charge number of Fe in one layer thereof and the charge number of Fe in the other layer do not match each other because there are many $Fe^{2+}$ in the one layer (the lower layer in the drawing), and there are many $Fe^{3+}$ in the other layer (the upper layer in the drawing).

Further, in this structure, from the standpoint of an average charge number of $Fe^{2.5+}$, $Fe^{2+}$ serves as a negative charge whose electrons are excessive, and $Fe^{3+}$ serves as a positive charge whose electrons are deficient. Accordingly, an electron arrangement and an electron density distribution in a dipolar form are formed by an ordered array structure of $Fe^{2+}$ and $Fe^{3+}$ as described above and deviation in the arrangement. Such a charge ordered structure in the W layer is formed by the coulomb interaction of $Fe^{2+}$ and $Fe^{3+}$ placed on the triangular lattices.

In the electronic device using $RFe_2O_{4-\delta}$, by utilizing such a phenomenon that a charge order is disarrayed by application of an electric field from the outside, it is possible to realize an electronic device in which a state of internal electrons is changed in accordance with application of a small electric field, thereby it is possible to change its electrical conductivity.

Further, in $(RMbO_{3-\delta})_n(MaO)_m$ which is more general, in the laminated structure of triangular lattice layers, because the charge number of Ma or Mb ions mainly composed of transition metal, that constitute a triangular lattice in one layer thereof, and the charge number of Ma or Mb ions mainly composed of transition metal, that constitute a triangular lattice in the other layer do not match each other, an electron arrangement in a dipolar form is formed. In an electronic device using $(RMbO_{3-\delta})_n(MaO)_m$, by utilizing such a phenomenon that a charge order is disarrayed by application of an electric field from the outside, in the same way as the case of using $RFe_2O_{4-\delta}$, it is possible to realize an electronic device in which a state of internal electrons is changed in accordance with application of a small electric field, thereby changing its electrical conductivity.

Here, in an electronic device such as a transistor device using a semiconductor of silicon or the like, as described above with respect to the conventional art, it is necessary to form a p-n junction with a p-type semiconductor and an n-type semiconductor. Further, at this p-n junction interface, an electric potential difference of, for example, approximately 0.7V is generated by an internal electric field. In contrast thereto, in a configuration using $(RMbO_3)_n(MaO)_m$ as a crystal of an electrical conductivity changeable body, a p-n junction is not required for a device operation, and thus, an electric potential difference (a voltage drop) by an internal electric field is not generated in the electrical conductivity changeable body. Accordingly, it is possible to realize an electronic device capable of operating at a small electric field and a low applied voltage as compared with those for a conventional transistor or the like.

Moreover, in a configuration using $(RMbO_3)_n(MaO)_m$ as a crystal of an electrical conductivity changeable body, a structure such as a p-n junction or the like is not required as described above, and it is possible to realize a function equivalent to that of a conventional transistor or the like with the single material. Therefore, it is possible to provide an electronic device independent of a situation of the market supply of the Si raw material, for example. Further, in the case of using $RFe_2O_4$ as a crystal of an electrical conductivity changeable body, stable device production is possible because iron is a raw material thereof.

Figure 8:
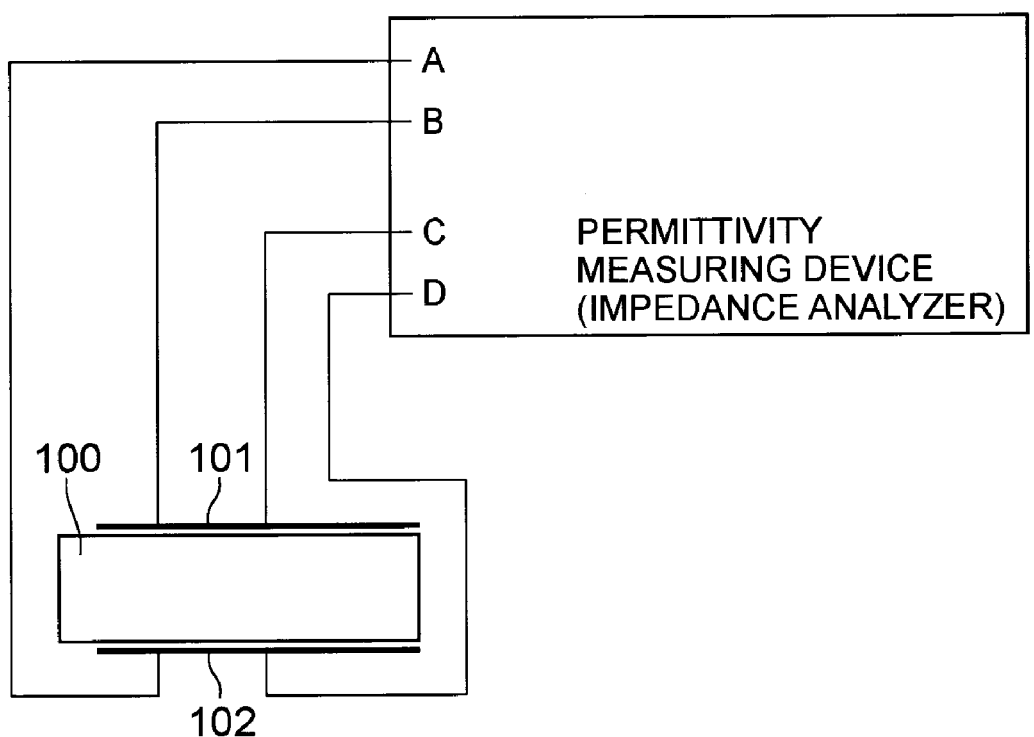
FIG. 8 is a diagram schematically showing a configuration of a permittivity measurement system for measuring alternating-current permittivity.

In the above-described crystal, the energy (corresponding to a band gap) necessary for recreating its arrangement of an electron group formed by their electron correlation can be determined by measurement results of alternating-current permittivity. FIG. 8 is a diagram schematically showing a configuration of a permittivity measurement system for measuring alternating-current permittivity. Here, a material such as $RFe_2O_4$, which will be a sample 100, is shaped in a pellet shape, to be a shape of a capacitor, and electrodes 101 and 102 are respectively formed on the upper surface and the lower surface thereof. Further, a permittivity measuring device has terminals A and B for applying an alternating-current voltage to the sample 100 and measuring an electric current flowing therein, and voltage measuring terminals C and D for feedback that is for keeping the alternating-current voltage constant. This configuration is a measurement configuration in standard impedance measurement broadly known.

Figure 9:
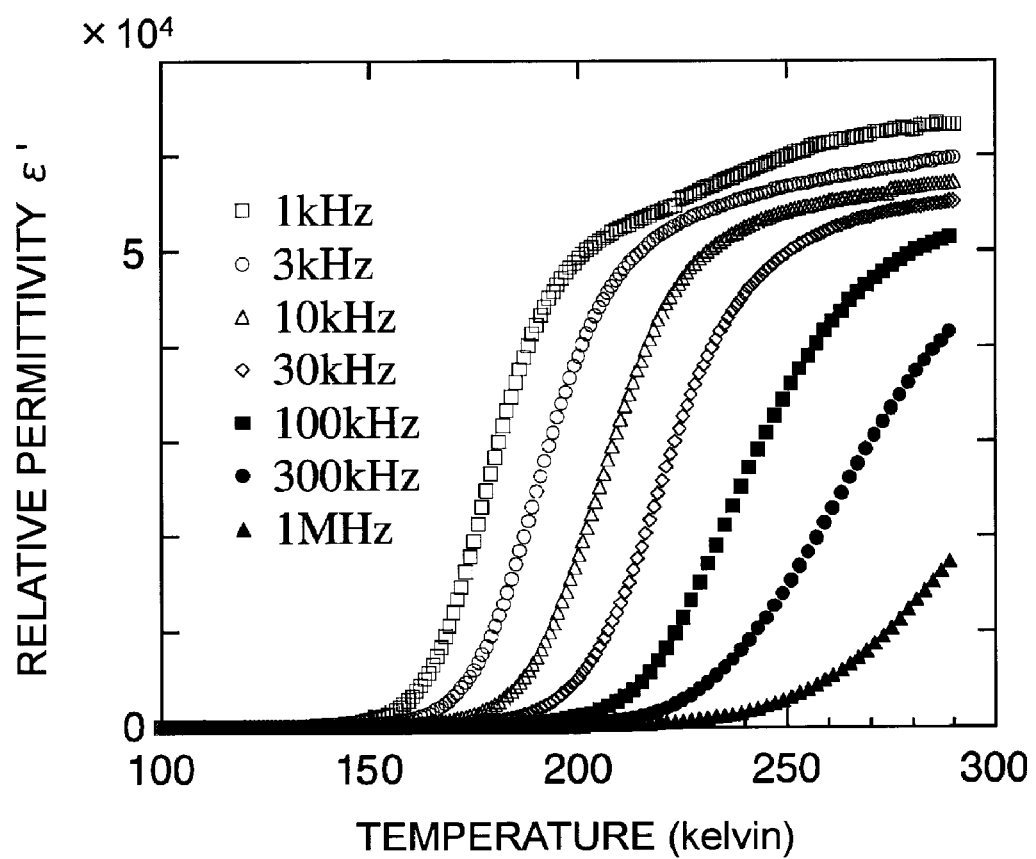
FIG. 9 is a graph showing measurement results of alternating-current permittivity with respect to $LuFe_2O_4$.

FIG. 9 is a graph showing measurement results of alternating-current permittivity in measurement performed by use of a crystal of $LuFe_2O_4$ as the sample 100, and the abscissa axis shows temperature (K), and the ordinate axis shows relative permittivity $\in'$. Further, the graph of FIG. 9 shows temperature changes of relative permittivity with respect to the respective frequencies of 1 kHz, 3 kHz, 10 kHz, 30 kHz, 100 kHz, 300 kHz, and 1 MHz. On the basis of these graphs, turn temperatures Tr of permittivity changes are determined for the respective frequencies. For example, with respect to data at a frequency of 1 kHz, the turn temperature is Tr=175K.

Figure 10:
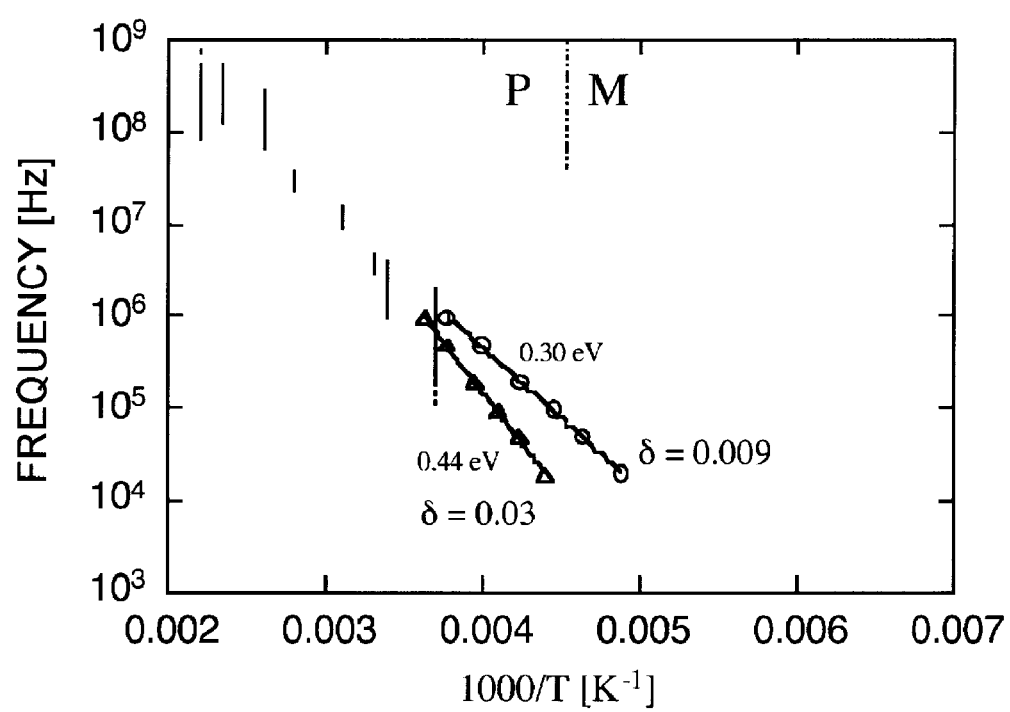
FIG. 10 is a graph showing a correlation between inverses of turn temperatures Tr of permittivity changes and measurement frequencies f.

FIG. 10 is a graph showing a correlation between inverses of turn temperatures Tr of permittivity changes and measurement frequencies f, and the abscissa axis shows 1000/Tr ($K^{-1}$), and the ordinate axis shows measurement frequency f (Hz). With respect to such a data plot, in order to best approximate the data, a parameter U in the following formula:

$$f=f_0\exp(-U/kT)$$

is determined. Here, k is a Boltzmann constant, and $f_0$ is a constant at the time of fitting.

Because the parameter U determined in this way is an amount having a temperature energy unit, a value thereof is divided by 11604, to be able to be converted into an eV unit. Further, this converted energy value corresponds to a band gap, and shows the activation energy necessary for recreating its arrangement of an electron group formed by their electron correlation. In the example shown in FIG. 10, an activation energy U=0.30 eV is obtained for the crystal whose oxygen defect δ=0.009, and it can be understood that it is a lower energy as compared with, for example, a band gap of silicon or the like.

Further, for example, a band gap of silicon is determined by an energy difference between levels that electrons have, which makes it impossible to adjust its value. In contrast thereto, in an electrical conductivity changeable body utilizing an electron correlation effect in a crystal and an electron arrangement in a dipolar form as described above, it is possible to adjust a value of such an activation energy U to some extent by adjusting its composition or the like. For example, in the example of FIG. 10, U=0.44 eV is obtained for the crystal whose oxygen defect is set to δ=0.03.

Here, the electrical conductivity changeable body is preferably composed of a single crystal or a polycrystal of a compound having a layered triangular lattice structure, or an aggregate of powder thereof. With respect to a crystal of the electrical conductivity changeable body, the above-described effect that its electrical conductivity changes in accordance with application of a small electric field can be obtained in any one of these modes. However, in the case in which an electronic device is configured by utilizing the crystal property dependent on a direction of a crystal axis in a crystal structure of an electrical conductivity changeable body, a mode necessary for that, for example, a single crystal of a compound having a layered triangular lattice structure is preferably used as an electrical conductivity changeable body.

Further, with respect to a configuration of the electric field applying means for applying an electric field to the electrical conductivity changeable body from the outside, as illustrated in FIG. 2, it is preferable that the electric field applying means includes a first electrode formed on the electrical conductivity changeable body, and a second electrode disposed so as to be electrically separated from the first electrode on the electrical conductivity changeable body, and is capable of applying an electric field to the electrical conductivity changeable body by applying a voltage between the first electrode and the second electrode. In accordance with such a configuration, it is possible to suitably apply an electric field necessary for changing its electrical conductivity to the electrical conductivity changeable body.

In this case, the electric field applying means may include voltage applying means such as a power source for applying a voltage between the first electrode and the second electrode. As a power source in this case, for example, a constant-voltage power supply, a constant-current power supply, or the like can be used in accordance with a configuration and a usage of the device, or the like. Or, the electric field applying means may be composed of only the first electrode and the second electrode described above, and may have a configuration in which a voltage applying device which is an external device is connected to these electrodes as needed.

Further, in the above-described configuration, the voltage applied between the first electrode and the second electrode of the electric field applying means is preferably a voltage of 0.7V or less. Thereby, it is possible to realize an electronic device which can be operated at a sufficiently low applied voltage as compared with, for example, a silicon transistor or the like. Further, the device whose electrical conductivity changes with such a low applied voltage is made possible by use of the compound having the crystal structure described above.

Next, a concrete example of the electronic device according to the present invention will be described. Note that, hereinafter, the configuration of the electronic device and the like in the case in which a compound used in an electrical conductivity changeable body is $RFe_2O_4$ will be described, however, the same configuration can be applied to the case in which $(RMbO_3)_n(MaO)_n$, is used as a compound of an electrical conductivity changeable body as well.

As a first concrete example of the electronic device according to the present invention, the electronic device may have a configuration in which the first electrode and the second electrode are disposed at positions opposing each other on a first axis for the layered triangular lattice structure of the electrical conductivity changeable body, a third electrode and a fourth electrode are formed at positions opposing each other on a second axis different from the first axis for the electrical conductivity changeable body, and a current-voltage property between the third electrode and the fourth electrode changes by applying a voltage between the first electrode and the second electrode.

Such a device can be used as a transistor device having a function as a transistor that controls a current-voltage property between the third and fourth electrodes by an applied voltage between the first and second electrodes as shown in FIG. 2 and FIG. 3. Further, in such a configuration, the first axis and the second axis serving as axes on which the electrodes are disposed are preferably axes perpendicular to one another from the standpoint of configuring the transistor element.

Figure 11:
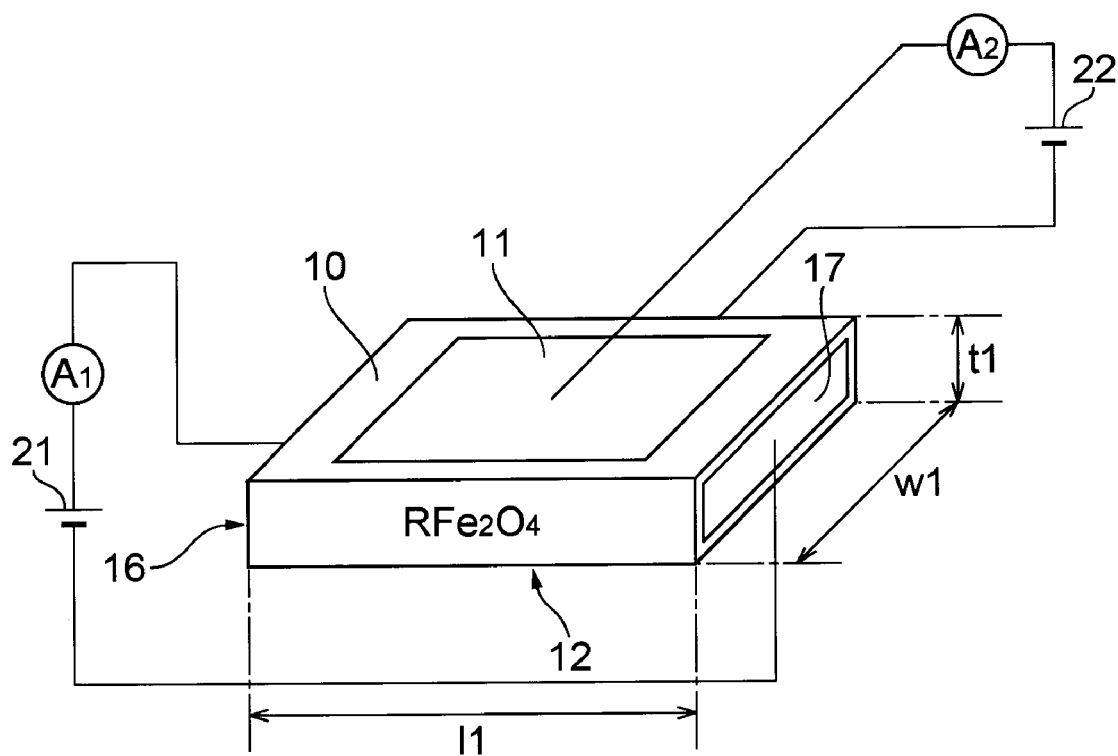
FIG. 11 is a diagram showing an example of a configuration of a transistor device.

FIG. 11 is a diagram showing an example of a configuration of a transistor device that is the electronic device according to the present invention. The transistor device according to the present configuration example corresponds to the electronic device 1 shown in FIG. 2, and includes the electrical conductivity changeable body 10 with $RFe_2O_4$ which is formed as a bulk body, the first electrode 11 and the second electrode 12 disposed at positions (on the upper surface and the lower surface) opposing each other on the first axis (the vertical axis in the drawing) with respect to the crystal structure of the electrical conductivity changeable body 10, and the third electrode 16 and the fourth electrode 17 disposed at positions (on the left surface and the right surface) opposing each other on the second axis (the horizontal axis in the drawing) perpendicular to the first axis with respect to the electrical conductivity changeable body 10. Further, in this configuration, electric field applying means for applying an electric field to the electrical conductivity changeable body 10 comprises the first electrode 11, the second electrode 12, and the power source 22.

The present transistor device is configured to be capable of controlling a change in its current-voltage property between the third and fourth electrodes 16 and 17 on the left and right sides by applying a voltage between the first and second electrodes 11 and 12 on the upper and lower sides by such a configuration. This is due to the phenomenon that the regular array of electrons existing in the crystal is disarrayed by application of a voltage and an electric current flowing thereby in the electrical conductivity changeable body 10.

Further, in the electrical conductivity changeable body 10 with $RFe_2O_4$, response properties such as disarray in an electron array with respect to application of a voltage and an electric current are different in the c-axis direction and the axis direction in the ab plane in the layered triangular lattice crystal structure thereof. Accordingly, the first axis and the second axis serving as axes on which the electrodes are disposed in the transistor device are preferably set in consideration of the properties of the respective crystal axes in the crystal structure. As an example of such a configuration, there is a configuration in which the vertical first axis in the drawing serving as an axis on which the first and second electrodes 11 and 12 are disposed is set as the axis in the ab plane, and the horizontal second axis in the drawing serving as an axis on which the third and fourth electrodes 16 and 17 are disposed is set as the c axis in the configuration shown in FIG. 2 and FIG. 11.

Here, a transistor using a silicon p-n junction is used as, for example, an amplifying device for voltage and electric current signals, a switch device that controls conducting of a high electric current by a small voltage, or the like. For such transistors, production facilities highly controlling a crystal purity of silicon are required. In contrast thereto, in the above-described transistor device utilizing that an electric field response of the electron array of $RFe_2O_4$ is anisotropic with respect to a crystal orientation, there is the advantage that such high-level production facilities are unnecessary.

Figure 12:
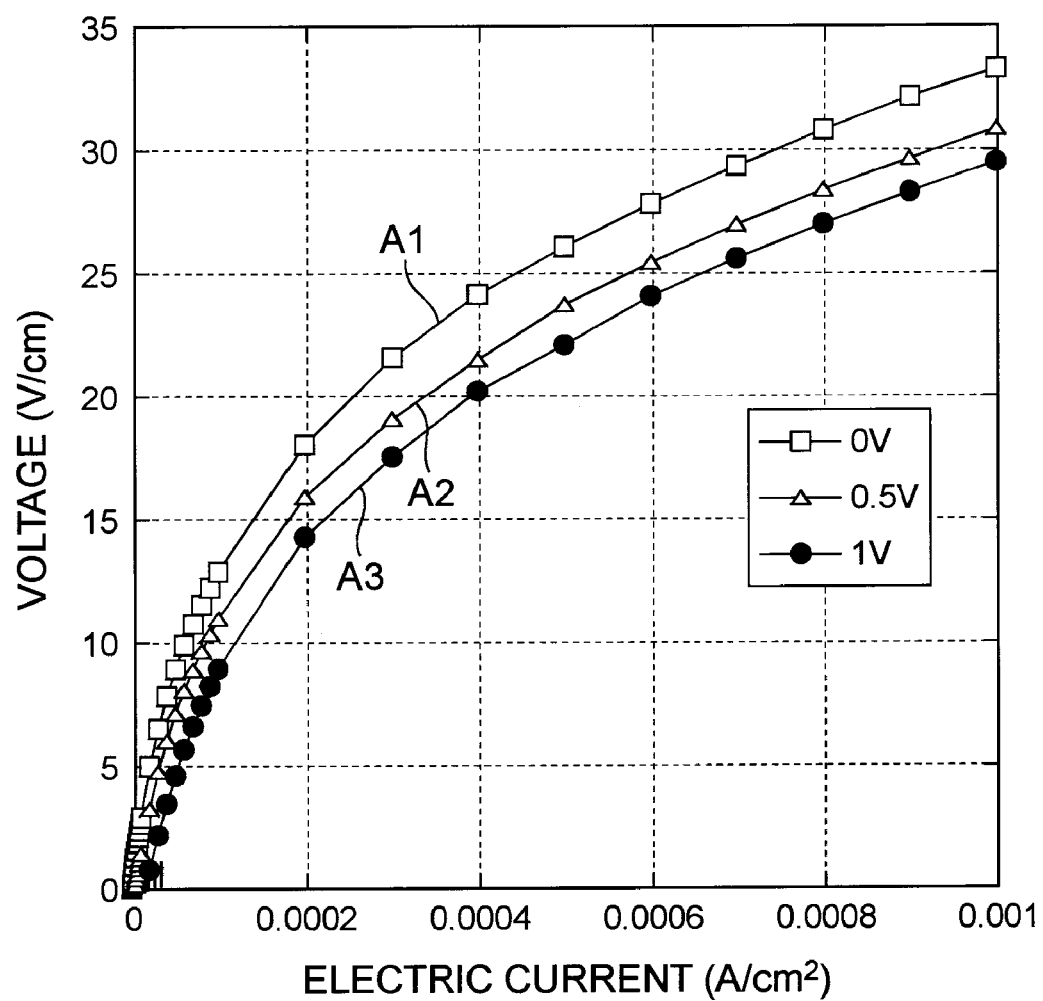
FIG. 12 is a graph showing a current-voltage property in the transistor device shown in FIG. 11.

FIG. 12 is a graph showing a current-voltage property in the transistor device shown in FIG. 11. Here, for the electrical conductivity changeable body 10, as described above, a single crystal of $LuFe_2O_4$ is disposed such that the first axis on which the electrodes 11 and 12 are disposed is set as an axis in the ab plane, and the second axis on which the electrodes 16 and 17 are disposed is set as the c axis, and a length in the c-axis direction is set to l1=2 mm, a width is set to w1=1 mm, and a thickness is set to t1=0.5 mm.

Further, in the graph of FIG. 12, the abscissa axis shows electric current density ($A/cm^2$) of an electric current made to flow between the electrodes 16 and 17 in the c-axis direction, and the ordinate axis shows electric field intensity (V/cm) of a voltage generated between the electrodes 16 and 17 by application of the electric current. Further, in the same way in the graph of FIG. 12, graph A1 shows a current-voltage property in the case in which a bias voltage applied between the electrodes 11 and 12 in a direction perpendicular to the c axis is 0V, graph A2 shows a current-voltage property in the case in which a bias voltage is 0.5V, and graph A3 shows a current-voltage property in the case in which a bias voltage is 1V.

As is understood from these graphs A1 to A3, when a voltage applied in the first axis direction perpendicular to the c axis is changed from 0V to 0.5V and 1V, a current-voltage property curve in the c-axis direction changes. For example, as for the case in which an electric current of 0.0004 $A/cm^2$ is made to flow in the c-axis direction, when a bias voltage in the direction in the ab plane is changed from 0V to 1V, the voltage in the c-axis direction changes by approximately 5V. This indicates the fact that a change in voltage which is amplified fivefold is obtained in the c-axis direction with respect to a change in voltage in the direction in the ab plane.

Note that, with respect to setting of the axes on which the electrodes are disposed for the electrical conductivity changeable body, in the above-described configuration example, the first axis serving as an axis on which the first and second electrodes for applying a bias voltage are disposed is set as an axis in the ab plane, and the second axis serving as an axis on which the third and fourth electrodes are disposed is set as the c axis, however, the setting is not limited to such a configuration concretely. For example, with a configuration in which the first axis serving as an axis on which the first and second electrodes for applying a bias voltage are disposed is set as the c axis, and the second axis serving as an axis on which the third and fourth electrodes are disposed is set as an axis in the ab plane, the same effect described above can be expected.

As a second concrete example of the electronic device according to the present invention, the electronic device may have a configuration in which the first electrode and the second electrode are disposed at positions opposing each other on a predetermined axis for the layered triangular lattice structure of the electrical conductivity changeable body, a current-voltage property of the electrical conductivity changeable body can be caused to make a transition from a high-resistive state to a low-resistive state by applying a voltage to make an electric current flow between the first electrode and the second electrode, and information is retained in the electrical conductivity changeable body by utilizing dependence on a resistance change history of the transition of the resistive state.

Such a device can be used as a memory device that retains information on the basis of, for example, a resistance change history by an electric current application history (a voltage application history) between the first and second electrodes or by a light irradiation history, and a change in resistive state of the electrical conductivity changeable body thereby.

In such a memory device, concretely, in the electrical conductivity changeable body, it is preferable that, in the case in which there is no electric current application history in one direction between the first electrode and the second electrode, when an electric current made to flow in the one direction between the first electrode and the second electrode is made to be increasing, its resistive state is caused to make a transition from a high-resistive state to a low-resistive state, and in the case in which there is an electric current application history in the one direction, when an electric current made to flow in the one direction between the first electrode and the second electrode is made to be increasing, its resistive state is in a low-resistive state, which does not accompany a transition of the resistive state. Thereby, it is possible to suitably realize retention of information in the memory device.

Further, in the electrical conductivity changeable body, it is more preferable that the electric current application history in the one direction is caused to disappear by making an electric current flow in the other direction between the first electrode and the second electrode. Thereby, it is possible to suitably realize erasing of the information retained in the memory device. Hereinafter, a property and an operation of such a memory device will be described with reference to its concrete example.

Figure 13:
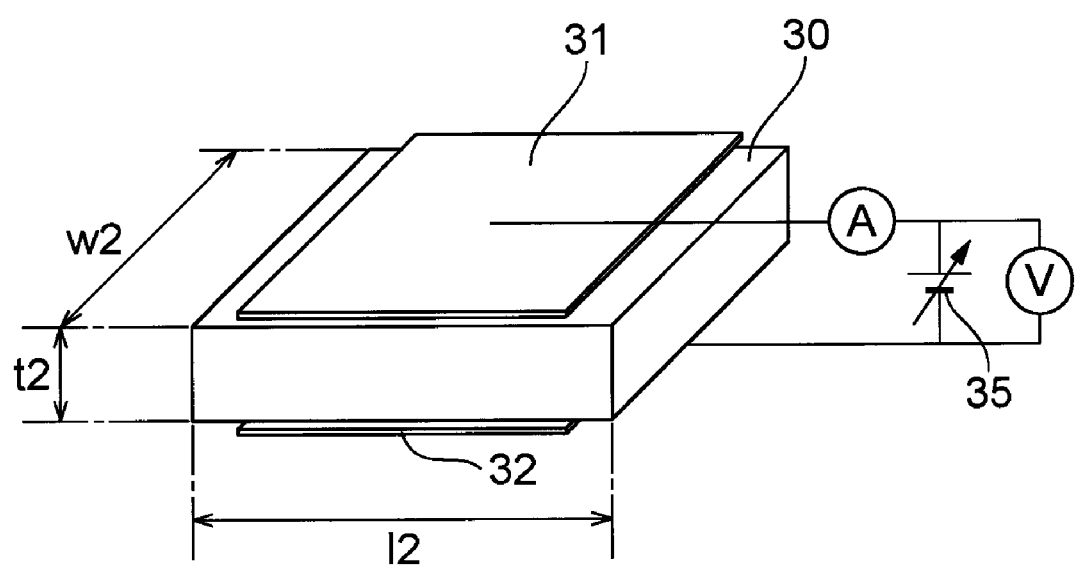
FIG. 13 is a diagram showing an example of a configuration of a memory device.

FIG. 13 is a diagram showing an example of a configuration of a memory device that is the electronic device according to the present invention. The memory device according to the present configuration example comprises an electrical conductivity changeable body 30 with $RFe_2O_4$ which is formed as a bulk body, a first electrode 31 and a second electrode 32 disposed at positions (on the upper surface and the lower surface) opposing each other on a predetermined axis (the vertical axis in the drawing) with respect to the crystal structure of the electrical conductivity changeable body 30. Further, a variable power source 35 such as a constant-current power supply is provided as voltage applying means between these electrodes 31 and 32. In the present configuration, electric field applying means for applying an electric field to the electrical conductivity changeable body 30 comprises the first electrode 31, the second electrode 32, and the power source 35.

Here, in $RFe_2O_4$ used in the electrical conductivity changeable body 30, in its crystal structure, electric polarizations are formed with an electron arrangement and an electron density distribution in a dipolar form by an ordered array structure of $Fe^{2+}$ and $Fe^{3+}$ and deviation in the arrangement, as described above. Further, the electric polarizations are laminated so as to be alternately turned in the c-axis direction, thereby forming the crystal structure of $RFe_2O_4$ into an antiferroelectric structure.

In this antiferroelectric structure by a charge order, when an electric field at a certain level is applied thereto, the charge order is disarrayed to change the state of electrons, and therefore, the resistive state of $RFe_2O_4$ changes from a high-resistive state to a low-resistive state in accordance with a level of an applied electric field. Further, such a change in resistive state has a property dependent on a voltage application history or an electric current application history for a crystal as will be described later.

The present memory device is configured as a memory element in which a change in resistance value is a unit of storage by utilizing such a property of the electrical conductivity changeable body 30 with $RFe_2O_4$. That is, the memory device shown in FIG. 13 is configured such that a current-voltage property of the electrical conductivity changeable body 30 is caused to make a transition from a high-resistive state to a low-resistive state by applying a voltage to make an electric current flow between the first and second electrodes 31 and 32 on the upper and lower sides, and information is retained in the electrical conductivity changeable body 30 by utilizing dependence on an electric current application history of the transition of the resistive state.

Figure 14:
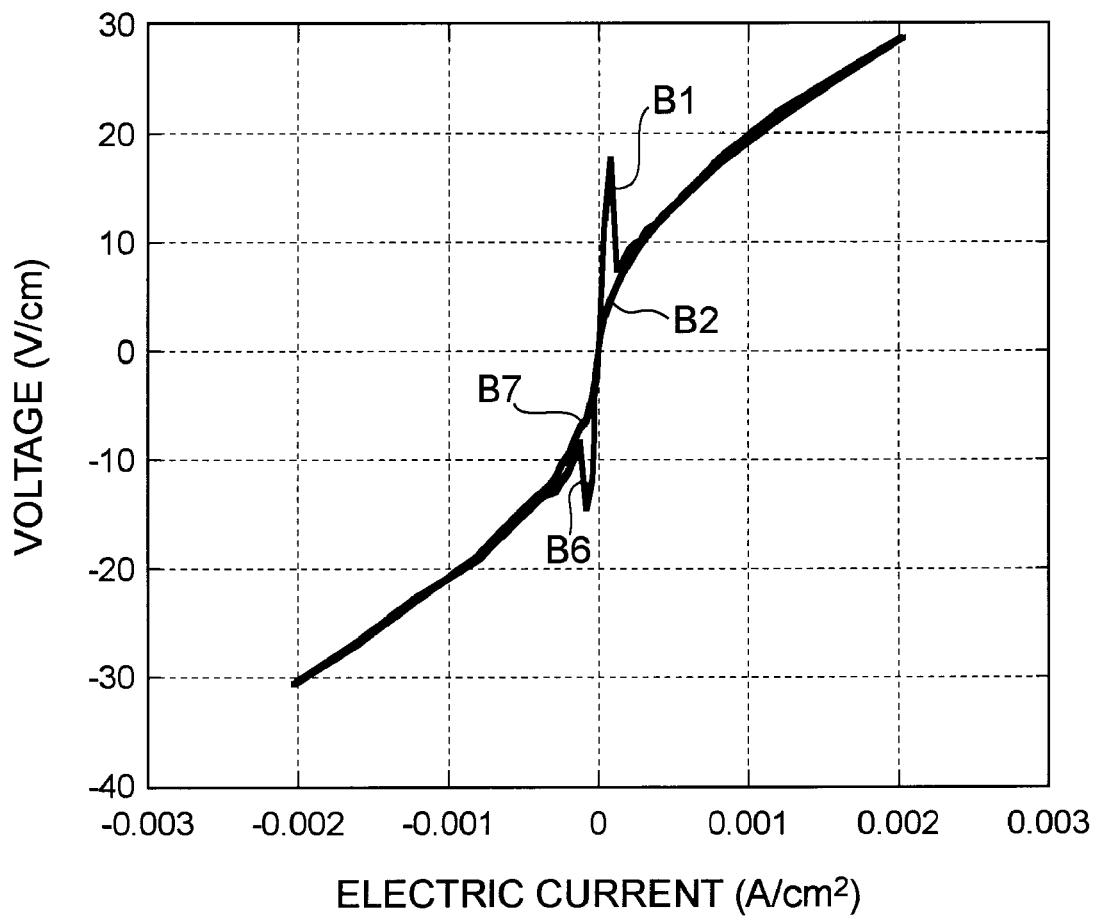
FIG. 14 is a graph showing changes in voltage with respect to application of an electric current in the memory device shown in FIG. 13.

FIG. 14 is a graph showing changes in voltage with respect to application of an electric current in the memory device shown in FIG. 13. Here, with respect to the electrical conductivity changeable body 30, a single crystal of $LuFe_2O_4$ is disposed such that a predetermined axis on which the electrodes 31 and 32 are disposed is set as the c axis, and a length in the horizontal direction is set to l2=2 mm, a width is set to w2=2 mm, and a thickness in the c-axis direction is set to t2=0.5 mm.

Further, in the graph of FIG. 14, the abscissa axis shows electric current density ($A/cm^2$) of an electric current made to flow between the electrodes 31 and 32 in the c-axis direction by the constant-current power source 35, and the ordinate axis shows electric field intensity (V/cm) of a voltage generated between the electrodes 31 and 32 by application of the electric current. Further, here, with respect to an electric current and a voltage to be applied between the electrodes 31 and 32, one direction thereof is set as a positive direction, and the other direction is set as a negative direction.

First, when a positive electric current is made to flow in the c-axis direction of the electrical conductivity changeable body 30 from the state in which an applied electric current is 0 and there is no electric current application history and the electric current is made to be gradually increasing, as shown on graph B1 of FIG. 14, at an initial stage of application of the electric current (at the stage at which the electric current density is $10^{-4}$ $A/cm^2$ or less on the graph B1), the crystal of $LuFe_2O_4$ is in a high-resistive state, and a high voltage is obtained. Then, when the electric current is further increased, the charge order in the antiferroelectric structure of the crystal collapses, and at the same time, its state is caused to make a transition to a low-resistive state in which the electrical conduction is favorable, which rapidly lowers a voltage. Hereinafter, for convenience of description, a point at which a transition of a resistive state is made when an electric current is made to be increasing is set as a transition point.

Next, after the electric current is returned to 0, a positive electric current is again made to flow in the c-axis direction, and the electric current is made to be gradually increasing. At this time, in the crystal of $LuFe_2O_4$, as shown on graph B2 of FIG. 14, because of an electric current application history that the positive electric current has been already applied, a high-resistive state does not appear even at a level of the electric current which is less than or equal to a transition point, to maintain the low-resistive state, which does not make a transition of the resistive state.

Such a resistive state is the same in the case in which a positive electric current is repeatedly applied three times or more, and at only the first application of an electric current from a state in which there is no electric current application history, a transition from a high-resistive state to a low-resistive state is made, and in a state in which there is an electric current application history, the resistive state is maintained as a low-resistive state. Further, such a phenomenon is the same as in the case in which a negative electric current is made to flow in the c-axis direction of the electrical conductivity changeable body 30, and in this case as well, as shown on graph B6 of FIG. 14, at only the first application of an electric current from a state in which there is no electric current application history, a transition from a high-resistive state to a low-resistive state is made, and in a state in which there is an electric current application history, as shown on graph B7 of FIG. 14, the resistive state is maintained as a low-resistive state.

Figure 15:
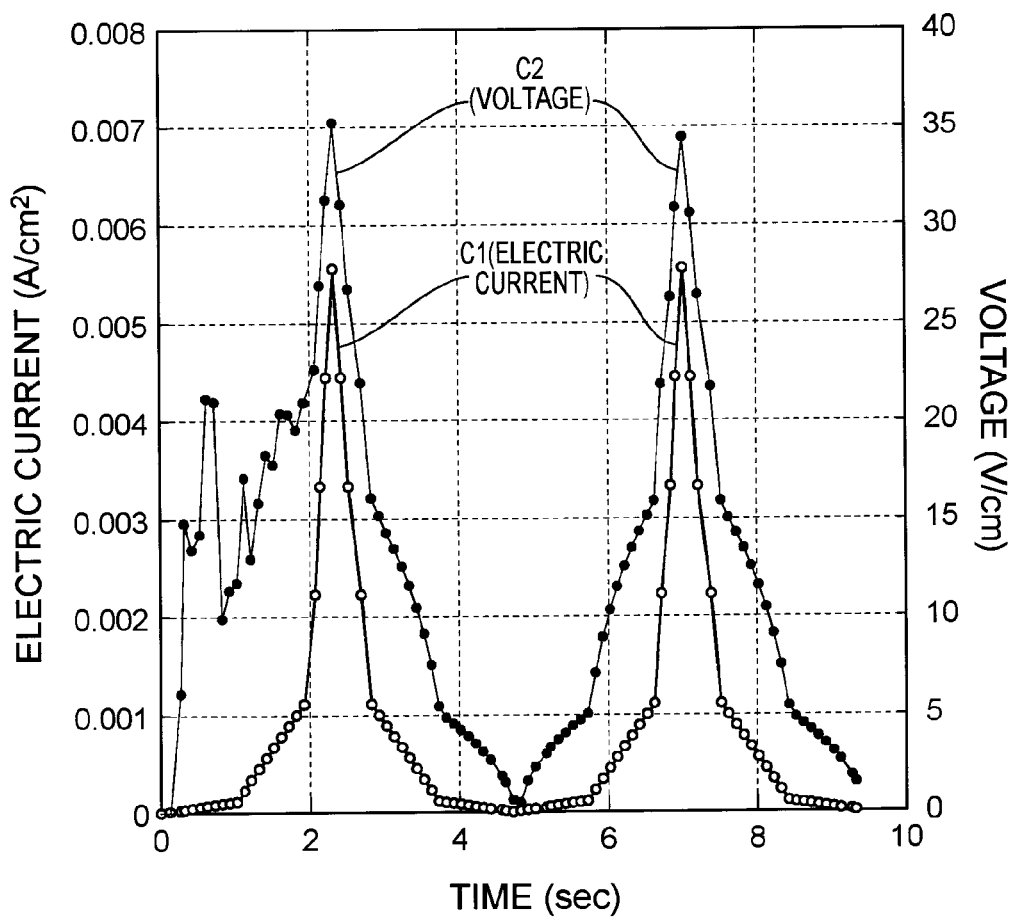
FIG. 15 is a graph showing changes in voltage with respect to application of an electric current in the memory device shown in FIG. 13.

FIG. 15 is a graph showing changes in voltage with respect to application of an electric current in the memory device shown in FIG. 13. This graph shows the above-described phenomenon when a positive electric current is made to flow in the c-axis direction of the electrical conductivity changeable body 30, as changes in a current-voltage property and a resistive state of the device with respect to time, and graph C1 shows changes with time in electric current density ($A/cm^2$) of an electric current made to flow in the c-axis direction, and graph C2 shows changes with time in electric field intensity (V/cm) of a voltage generated in the c-axis direction.

In this measurement, as shown on the graph C1 of the electric current, a positive electric current is repeatedly applied twice with the same time waveform in the c-axis direction of the electrical conductivity changeable body 30. In contrast thereto, on the graph C2 of the voltage, with the first application of electric current, at an initial stage of the application of electric current, a high-resistive peak due to the crystal of $LuFe_2O_4$ being in a high-resistive state is caused to appear. On the other hand, with the second application of electric current, a high-resistive peak is not caused because there is already an electric current application history.

In the present memory device, by utilizing such a property of the crystal of $RFe_2O_4$, it is possible to perform operations of writing, retaining, and reading information in the electrical conductivity changeable body 30. That is, when a positive electric current is made to flow once so as to be at a level over the transition point to the electrical conductivity changeable body 30, a transition from the high-resistive state to the low-resistive state is made. Then, thereafter, due to the dependence on an electric current application history of a resistive state, the low-resistive state in which the charge order is disarrayed and the state of electrons is changed is retained as is.

Further, it is possible to read whether the electrical conductivity changeable body 30 is in a high-resistive state, or in a low-resistive state via a positive electric current application history, by that a sufficient small positive electric current which does not reach the transition point is applied, and a voltage generated at that time is measured to judge the levels of its resistance value. Thereby, it is possible to perform writing, retaining, and reading information with a change in resistance value as a unit of storage in a format as an electric current application history for the electrical conductivity changeable body 30. Such operations are the same in the case in which a negative electric current is used in place of a positive electric current as well.

Further, in the present memory device, it is possible to cause an electric current application history (a voltage application history) in one direction (for example, a positive direction) to disappear by making an electric current flow in the other direction (a negative direction). That is, for example, when a negative electric current is applied to a crystal of $RFe_2O_4$ of the electrical conductivity changeable body 30 having an electric current application history that a positive electric current is applied, the electric current application history on the positive electric current is caused to disappear thereby, and a high-resistive state for application of a positive electric current is recovered.

In this case, when a positive electric current is again applied to the electrical conductivity changeable body 30 thereafter, this is considered as the first application of positive electric current, and a transition from a high-resistive state to a low-resistive state is made. Such an operation of causing an electric current application history to disappear corresponds to an operation of erasing and initializing information retained in the electrical conductivity changeable body 30.

In this way, in accordance with the memory device shown in FIG. 13, by combining an operation of applying an electric current and a voltage in one direction by the electrodes 31 and 32 disposed in the c-axis direction, the number of times thereof, and an operation of applying an electric current and a voltage in the other direction, it is possible to realize memory operations of writing, retaining, reading, and erasing information. Note that, in the above-described configuration example, for the electrical conductivity changeable body 30, a predetermined axis on which the electrodes 31 and 32 are disposed is set as the c axis, however, the axis on which the electrodes are disposed is not limited to the c axis, and, for example, an axis on which the electrodes 31 and 32 are disposed may be set as an axis in the ab plane.

In such a memory device, it suffices to form only electrode terminals for applying an electric current to the electrical conductivity changeable body 30, and therefore, the number of components is fewer as compared with that of a conventional memory device, and its manufacturing cost is reduced.

Further, it has been found that the charge ordered structure in the crystal of $RFe_2O_4$ described above exists even in a size of approximately 10 nm. Accordingly, in accordance with the device having the above-described configuration, a memory circuit device can be manufactured in a small size of approximately 10 nm, which makes it possible to realize a memory element having a memory density of 1 $Tbit/cm^2$ or more.

Further, in this memory device, a high-purity silicon device is unnecessary in the same way as in the above-described transistor device, and therefore, it is possible to manufacture the device with inexpensive production facilities. Further, because only a change in state of an electron arrangement in a crystal is set as a unit of storage, its operation is at high speed, and its power consumption is small. Further, because a special power source for retaining information in the memory device is not necessary, its production cost is inexpensive.

Note that from the operation curves of the electric current and the voltage on the graphs shown in FIG. 14, it is understood that the charge order is disarrayed at the point in time when the electric field intensity of the voltage reaches approximately 20V/cm, to cause a change in state of electrons, in the vicinity of the original point (at an initial stage of application of an electric current). This voltage value of 20V/cm is an extremely small value as a voltage in a material as compared with, for example, that there is an electric field of 1 kV/cm or more in the vicinity of a silicon p-n junction interface, and it can be said that the effect of a change in electrical conductivity by a change in state of electrons and the like is exerted with an extremely small electric field as compared with that of a p-n junction.

Considering the voltage value of 20V/cm described above, for example, when the thickness of the crystal of $RFe_2O_4$ in the electronic device is 1 μm, the phenomenon of a change in state of electrons as described above is caused to appear by applying a voltage of approximately 2 mV to the crystal of $RFe_2O_4$. Further, considering the manufacture of an integrated circuit by use of a device having such a property, it is possible to configure an electronic circuit which can be driven by several mV. If a circuit can be operated at approximately $1/1000$ of the voltage for a conventional transistor integrated circuit, to simply calculate, it can be expected that its power consumption is $(1/1000)^2$, that is approximately parts per million in a circuit composed by use of the above-described electronic device, and the performance that its operation speed is thousandfold is obtained.

The electronic device and the electrical conductivity control method according to the present invention are not limited to the above-described embodiments and the configuration examples, and various modifications are possible. For example, with respect to a configuration of a transistor device, FIG. 2 and FIG. 11 show the examples thereof, and concretely, various configurations for, for example, a shape of an electrical conductivity changeable body, shapes and arrangements of electrodes, and the like may be used. Further, with respect to a configuration of a memory device, various configurations may be used in the same way. Further, the electronic device according to the present invention can be applied to various elements other than the transistor element and the memory element described above.

INDUSTRIAL APPLICABILITY

The present invention can be applied to an electronic device including an electrical conductivity changeable body whose electrical conductivity changes according to an electric field and electric field applying means for applying an electric field to the electrical conductivity changeable body, and to an electrical conductivity control method using the device, and in particular, to a computer logic device, a high-current switch circuit, or further to a transistor device, a memory device, and the like.

The invention claimed is:

1. An electronic device comprising:
an electrical conductivity changeable body in which a state of internal electrons is changed according to an electric field applied from the outside, to change its electrical conductivity; and
electric field applying means for applying an electric field to the electrical conductivity changeable body from the outside, wherein
the electrical conductivity changeable body comprises a compound having a layered triangular lattice structure, whose composition is expressed by $(RMbO_{3-\delta})_n(MaO)_m$ (where R is at least one element selected from In, Sc, Y, Dy, Ho, Er, Tm, Yb, Lu, Ti, Ca, Sr, Ce, Sn and Hf; Ma and Mb are at least one element selected from Ti, Mn, Fe, Co, Cu, Ga, Zn, Al, Mg and Cd so as to allow their overlapping; n is an integer number of 1 or more; m is an integer number of 0 or more; and $\delta$ is a real number of 0 or more and 0.2 or less).

2. The electronic device according to claim 1, wherein the compound having the layered triangular lattice structure is $RFe_2O_{4-\delta}$.

3. The electronic device according to claim 1, wherein the electric field applying means includes
a first electrode formed on the electrical conductivity changeable body, and
a second electrode disposed so as to be electrically separated from the first electrode on the electrical conductivity changeable body, and
the electric field applying means is capable of applying the electric field to the electrical conductivity changeable body by applying a voltage between the first electrode and the second electrode.

4. The electronic device according to claim 3, wherein the electric field applying means includes voltage applying means for applying the voltage between the first electrode and the second electrode.

5. The electronic device according to claim 3, wherein the voltage applied between the first electrode and the second electrode is a voltage of 0.7V or less.

6. The electronic device according to claim 3, wherein the first electrode and the second electrode are disposed at positions opposing each other on a first axis for the layered triangular lattice structure of the electrical conductivity changeable body, and
a third electrode and a fourth electrode are formed at positions opposing each other on a second axis different from the first axis for the electrical conductivity changeable body, and
a current-voltage property between the third electrode and the fourth electrode changes by applying the voltage between the first electrode and the second electrode.

7. The electronic device according to claim 3, wherein the first electrode and the second electrode are disposed at positions opposing each other on a predetermined axis for the layered triangular lattice structure of the electrical conductivity changeable body, and
a current-voltage property of the electrical conductivity changeable body can be caused to make a transition from a high-resistive state to a low-resistive state by applying the voltage to make an electric current flow between the first electrode and the second electrode, and information is retained in the electrical conductivity changeable body by utilizing dependence on a resistance change history of the transition of the resistive state.

8. The electronic device according to claim 7, wherein, in the electrical conductivity changeable body,
in the case in which there is no electric current application history in one direction between the first electrode and the second electrode, when an electric current made to flow in the one direction between the first electrode and the second electrode is made to be increasing, its resistive state is caused to make a transition from the high-resistive state to the low-resistive state, and
in the case in which there is an electric current application history in the one direction, when an electric current made to flow in the one direction between the first electrode and the second electrode is made to be increasing, its resistive state is in the low-resistive state, which does not accompany a transition of the resistive state.

9. The electronic device according to claim 8, wherein, in the electrical conductivity changeable body,
the electric current application history in the one direction is caused to disappear by making an electric current flow in the other direction between the first electrode and the second electrode.

10. An electrical conductivity control method comprising:
applying an electric field to an electrical conductivity changeable body from the outside; and controlling a change in electrical conductivity of the electrical conductivity changeable body on the basis of a change in state of internal electrons according to the electric field applied to the electrical conductivity changeable body, wherein
the electrical conductivity changeable body comprises a compound having a layered triangular lattice structure, whose composition is expressed by $(RMbO_{3-\delta})_n(MaO)_m$ (where R is at least one element selected from In, Sc, Y, Dy, Ho, Er, Tm, Yb, Lu, Ti, Ca, Sr, Ce, Sn and Hf; Ma and Mb are at least one element selected from Ti, Mn, Fe, Co, Cu, Ga, Zn, Al, Mg and Cd so as to allow their overlapping; n is an integer number of 1 or more; m is an integer number of 0 or more; and $\delta$ is a real number of 0 or more and 0.2 or less).

11. The electrical conductivity control method according to claim 10, wherein the compound having the layered triangular lattice structure is $RFe_2O_{4-\delta}$.

* * * * *